United States Patent [19]

Negle

[11] Patent Number: 5,008,913
[45] Date of Patent: Apr. 16, 1991

[54] MEASURING AND DAMPING RESISTOR ARRANGEMENT FOR A HIGH-VOLTAGE APPARATUS

[75] Inventor: Hans Negle, Nahe, Fed. Rep. of Germany

[73] Assignee: U.S. Philips Corporation, New York, N.Y.

[21] Appl. No.: 107,872

[22] Filed: Oct. 7, 1987

Related U.S. Application Data

[63] Continuation of Ser. No. 37,122, Apr. 9, 1987, abandoned, which is a continuation of Ser. No. 880,335, Jun. 24, 1986, abandoned, which is a continuation of Ser. No. 578,250, Feb. 7, 1984, abandoned.

[30] Foreign Application Priority Data

Feb. 9, 1983 [DE] Fed. Rep. of Germany ....... 3304316

[51] Int. Cl.$^5$ .............................................. H05G 1/10
[52] U.S. Cl. ...................................... 378/105; 378/91; 363/68; 174/35 R
[58] Field of Search ...................... 378/91, 105; 363/68, 363/141; 324/407; 174/35 R

[56] References Cited

U.S. PATENT DOCUMENTS

| | | | |
|---|---|---|---|
| 3,373,336 | 3/1968 | Schillmann et al. | 363/68 |
| 3,398,351 | 8/1968 | Kuntke | 363/68 |
| 3,444,452 | 5/1969 | Janssen | 363/68 |
| 3,601,656 | 8/1971 | Smith et al. | 174/35 R |

OTHER PUBLICATIONS

Van Nostrand's Scientific Encyclopedia, Fifth Edition, Copyright 1976, p. 1913.

Primary Examiner—Carolyn E. Fields
Assistant Examiner—David P. Porta
Attorney, Agent, or Firm—David R. Treacy

[57] ABSTRACT

The invention relates to a measuring and damping resistor arrangement for a high-voltage apparatus. The measuring resistor arrangement preferably includes several series-connected resistors which are arranged on a support and which are capacitively bridged and is electrostatically shielded by a damping resistor arrangement. Preferably, the damping resistor arrangement is formed by a resistance wire wound onto an insulating body which encloses a part of the measuring resistor arrangement at the high-voltage side.

13 Claims, 1 Drawing Sheet

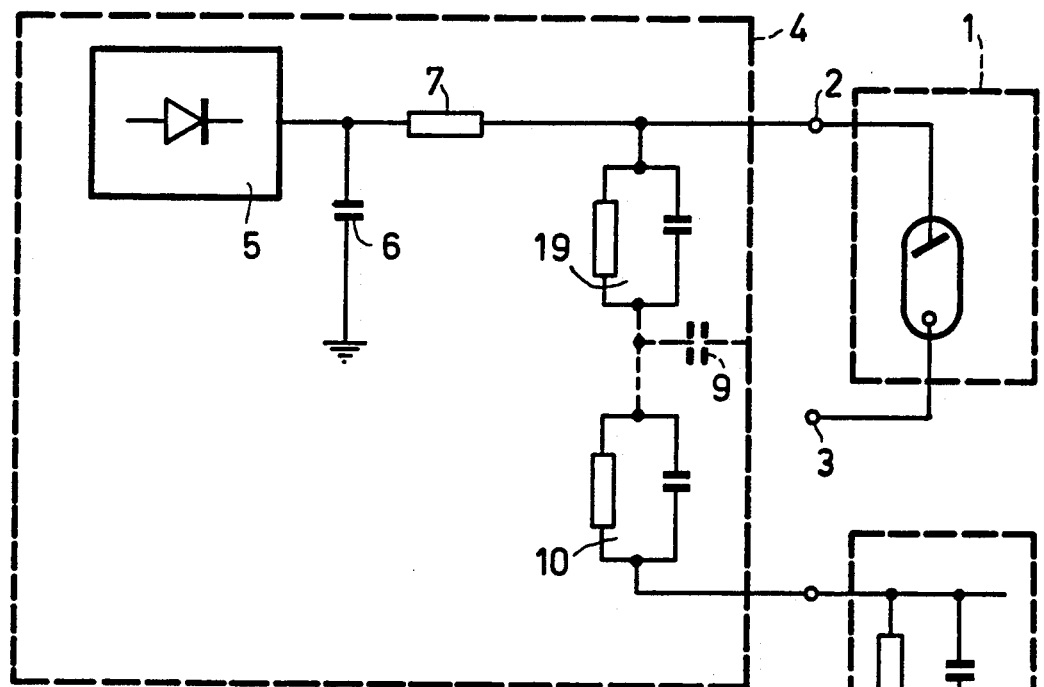
FIG.1 PRIOR ART
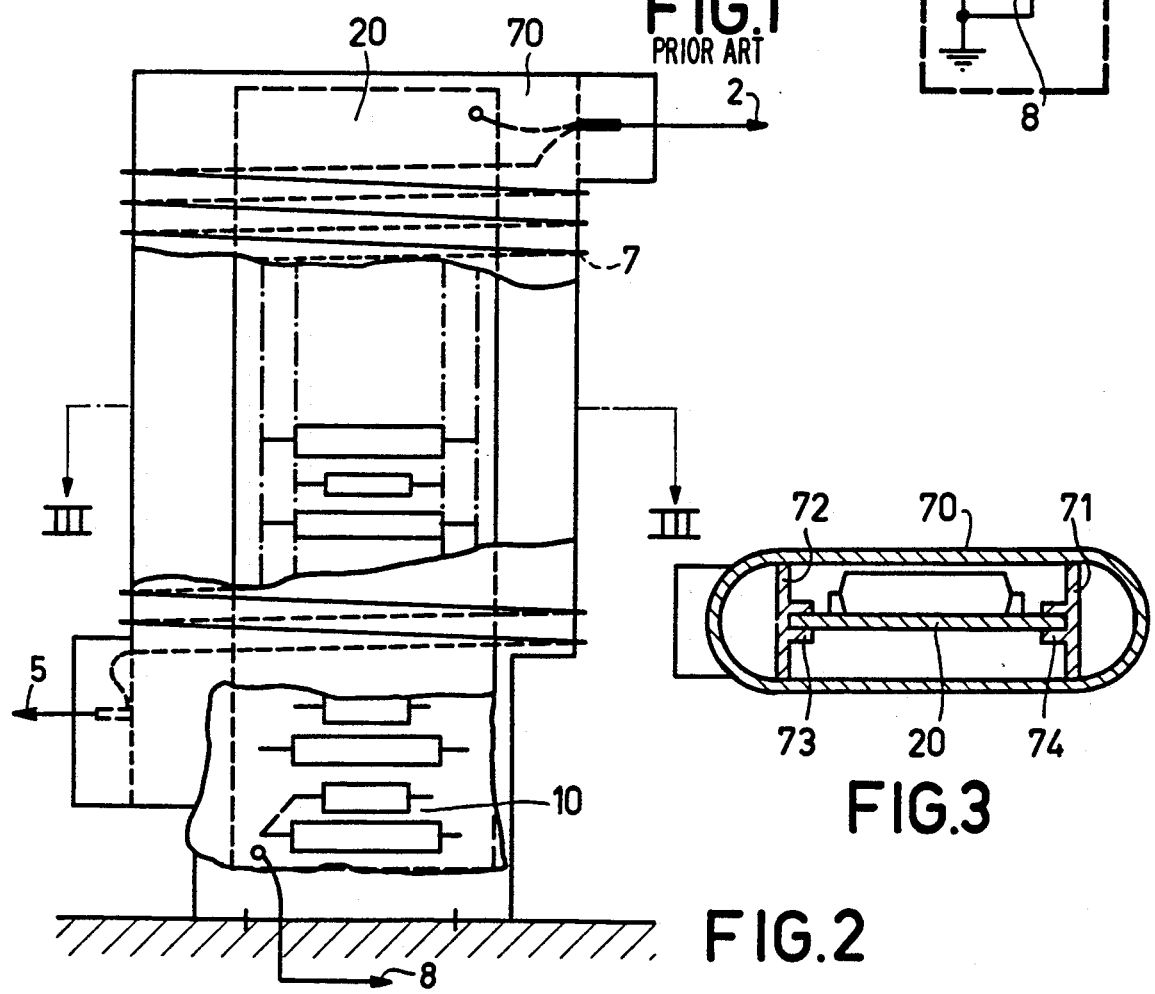
FIG.2
FIG.3

MEASURING AND DAMPING RESISTOR ARRANGEMENT FOR A HIGH-VOLTAGE APPARATUS

This is a continuation of application Ser. No. 037,122, filed Apr. 9, 1987, now abandoned, which is a continuation of application Ser. No. 880,335, filed Jun. 24, 1986, now abandoned, which is a continuation of application Ser. No. 578,250, filed Feb. 7, 1984, now abandoned.

BACKGROUND OF THE INVENTION

The invention relates to a measuring and damping resistor arrangement for a high-voltage apparatus, notably an X-ray generator, in which a measuring resistor arrangement carries a high voltage and is connected to a damping resistor arrangement on the high-voltage side in the operating condition.

FIG. 1 shows a known circuit arrangement of this kind in the form of an X-ray generator. The anode connection 2 of an X-ray tube 1 is connected to a positive high voltage while its cathode connection 3 is connected to a negative high voltage. The high voltages are supplied by a high-voltage generator 4. The terminal 2 which carries a positive high voltage with respect to ground is connected, via a damping resistor 7, to the output of a high-voltage rectifier 5 which is connected to a high-voltage transformer (not shown) and whose output voltage is smoothed by a capacitor 6. The damping resistor 7 serves to limit the current through the X-ray tube in the case of a tube breakdown.

The voltage across the X-ray tube can be measured by means of a measuring divider which is connected between the connection 2 and ground. The measuring divider consists of ten series-connected RC-members 10 ... 19, only the first (10) and last (19) of which are shown and which are connected to ground via a terminating RC-member 8. The resistance of each of the RC-members 10 ... 19 amounts to 10 Mohms, while the resistance of the RC-member 8 amounts to only 10 kohms, so that the high voltage is reduced by one tenth by each of the resistors of the RC-members 10 ... 19 and one ten thousandth part of the high voltage is present across the resistor of the RC member 8 for the purpose of measurement.

The construction of the section of the high-voltage generator 4 which generates the negative high voltage for the connection 3 of the X-ray tube 1 is identical to that of the section described thus far; however, the polarity of the rectifier must be reversed in order to ensure that the high voltage generated has the reverse polarity.

It is essential that the voltage on the terminating member 8 follows quick variations on the connection 2, i.e. the transfer bandwidth of the measuring divider 8, 10 ... 19 must be sufficiently large. To this end, parallel-connected capacitors are provided in the individual RC-members; these capacitors are proportioned so that the same time constant (approximately 10 ms) is obtained for each RC-member. These capacitors neutralize the effect of the supply lead inductances and the stray capacitances of the individual resistors. However, the transfer bandwidth is still limited and, moreover, also dependent on the position of the RC-members 10 . . . 19 (referred to hereinafter as the measuring resistor arrangement) within the high-voltage generator. This is due to the stray capacitance between the individual RC-members and their surroundings, notably the grounded housing of the high-voltage generator; one of these capacitances is diagrammatically represented by a capacitor 9 which is shown in broken lines in the drawing. As is evident from the circuit diagram, in the case of quick variations of the high voltage, part of the current through the measuring resistor arrangement flows directly to ground via these stray capacitances. The currents flowing via the stray capacitances are larger as the high voltage is higher, so that the voltage drop occurring across the RC-member 19 at the high-voltage side is larger than that across the RC-member 10 which is connected to ground via the terminating RC-member 8. This limits the transfer bandwidth and reduces the measuring accuracy for high frequencies.

SUMMARY OF THE INVENTION

It is the object of the present invention to provide an arrangement of the kind set forth so that a compact construction is obtained which also enables measurement of quick variations of the high voltage.

This object is achieved in accordance with the invention in that the part of the measuring resistor arrangement which carries high-voltage potential in the operating condition is enclosed by the damping resistor arrangement.

The damping resistor arrangement in accordance with the invention not only serves for current limitation but also for electrostatically shielding the measuring resistor arrangement, or at least its high-voltage side, from the surroundings. Even though stray capacitances arise between the measuring resistor arrangement and the damping resistor arrangement, the currents flowing thereacross are reduced because the damping resistor arrangement carries approximately the same high-voltage potential as the enclosed part of the measuring resistor arrangement.

It would in principle also be possible to use a hollow-cylindrical resistor having a stable construction for the damping resistor arrangement, but such a solution would be comparatively expensive. Consequently, in a preferred embodiment of the invention the damping resistor arrangement comprises a resistance wire which is wound onto an insulating body which encloses the measuring resistor arrangement.

In a further version of this embodiment the measuring resistor arrangement comprises several resistors which are accommodated on a support and each of which is capacitively bridged, the insulating body being constructed as a holder for the support.

The invention will be described in detail hereinafter with reference to the accompanying drawing.

BRIEF DESCRIPTION OF THE DRAWING

FIG. 1 shows an X-ray generator in which may the arrangement in accordance with the invention can be used, FIG. 2 is a side elevational view and FIG. 3 is a sectional view taken along the line III-III of the arrangement shown in FIG. 2.

DESCRIPTION OF THE PREFERRED EMBODIMENT

As appears from the FIGS. 2 and 3, an elongated printed circuit board 20 is detachably arranged inside a hollow-cylindrical insulating body 70 which comprises connecting portions 71, 72 which extend parallel to the cylinder axis and which comprise guides 73, 74, respectively, in which the board can be displaced in the direction of the cylinder axis and which serve to hold the board. The board serves as a support for the RC-members 10 . . . 19 which are connected in series and arranged thereon in the sequence of the high-voltages present in the operating condition, so that the potentials on the board increase from the bottom upwards in the direction of the cylinder axis in the operating condition.

On the part of the insulating body 70 which encloses the upper RC-members, there is wound an external resistance wire 7 which acts as the damping resistor in the circuit and which is connected between the user (X-ray tube 1) and the high-voltage source (rectifier 5) in the high-voltage apparatus, one of its ends being electrically conductively connected to the connection of the measuring resistor arrangement on the high-voltage side. The resistance wire 7 is proportioned and arranged so that the thermal energy developed in the case of a short-circuit is stored in the damping resistor, the heat developed during stationary operation being continuously transferred to an insulating medium (for example, transformer oil) in the high-voltage apparatus. Moreover, the resistor wire is arranged and the insulating body 70 is proportioned so that neither internal nor external flash-overs can occur during normal operation or in the case of short-circuits.

The resistance wire is thus a solid element having a surface with a voltage gradient along the surface. This gradient has a high frequency component in the direction of elongation which will neutralize effects of stray capacitance in the measuring resistor arrangement.

The upper part of the measuring resistor arrangement which is enclosed by the resistance wire 7 is substantially shielded against external electric fields, so that the currents flowing via stray capacitances are substantially reduced. When the measuring resistor arrangement of FIG. 1 is extended so as to form a measuring divider, the arrangement shown in the FIGS. 2 and 3 produces a 3-dB limit frequency of approximately 200 kHz which decreases to approximately 30 kHz when the shielding by the resistance wire is omitted. It is a further advantage of the arrangement in accordance with the invention that the transfer bandwidth is substantially independent of the location where the arrangement is accommodated inside the high-voltage apparatus. Therefore, it can be used in different types of high-voltage generators without the risk of a changed transfer bandwidth. It is a further advantage of the shielding that the increased voltage drop is reduced at the upper RC-members so that overloading is definitely precluded even in the case of surge loads (ingress of transient waves in the case of a faulty X-ray tube in an X-ray generator).

Further advantages of the invention consists in that the volume required for the building in of the arrangement in accordance with the invention is smaller and in that the manufacturing costs are lower, because the insulating body 70 supports the resistance wire 7 and holds the board 20 at the same time. The insulation clearances with respect to ground potential can thus be used in common, so that the complete arrangement (damping resistor and measuring resistor arrangement) requires a substantially reduced volume for building in (about one half).

If desired, an even larger transfer bandwidth can be achieved by using, instead of the cylindrical shape for the winding and the insulating body, a (bell) shape such that the resultant potential distribution corresponds substantially to the potential distribution across the printed circuit board.

What is claimed is:

1. A high-voltage apparatus, comprising
   a voltage source having an output which is at a high voltage with respect to ground;
   a terminal which is at a high voltage with respect to ground during normal operation of the apparatus;
   a damping resistor connecting said source output to said terminal for conducting and limiting current to a load connected to said terminal; and
   a measuring resistor arrangement connected to a point between the damping resistor and the terminal,
   characterized in that the apparatus comprises an insulating body enclosing a part of the measuring resistor arrangement, said part having stray capacitance to ground,
   said apparatus includes a capacitance neutralization element surrounding said body and said part, and extending in a direction of elongation, said element being a solid element having a surface with a voltage gradient along said surface of said element; in response to high frequency voltages at said terminal, said voltage gradient having a high frequency component in said direction of elongation for neutralizing effects of said stray capacitance, and
   the damping resistor comprises a resistance wire wound around said body, said resistance wire being said solid element, arranged so as to surround at least a portion of said arrangement adjacent said point, and to shield at least part of the measuring resistor arrangement so as to reduce the effect of stray capacitances from said arrangement to ground.

2. An apparatus as claimed in claim 1, characterized in that said insulating body comprises a hollow member having internal mounting portions, said arrangement being supported by said mounting portions.

3. An apparatus as claimed in claim 2, characterized in that said arrangement comprises an elongated board and a plurality of RC members mounted on the board, and
   said hollow member has an elongated axis, said board being mounted with the direction of elongation parallel to said axis.

4. An arrangement as claimed in claim 3, characterized in that said member is cylindrical with an oval cross-section, and said internal mounting portions comprise connecting portions extending parallel to said axis, and guides for holding said board.

5. A high-voltage apparatus, comprising
   a voltage source having an output voltage which is at a high voltage with respect to ground;
   means for smoothing said output voltage with respect to ground, whereby said output voltage is a smoothed voltage;
   a terminal which is at a high voltage with respect to ground during normal operation of the apparatus;
   a damping resistor connecting said source output voltage to said terminal for conducting and limiting current to a load connected to said terminal; and
   a measuring resistor arrangement connected to a point between the damping resistor and the terminal,
   characterized in that the apparatus comprises an insulating body enclosing a part of the measuring resistor arrangement, said part having stray capacitance to ground, said apparatus includes a capacitance neutralization element surrounding said body and said part, and extending in a direction of elongation, said element being a solid element having a surface with a voltage gradient along said surface of said element; in response to high frequency voltages at said terminal, said voltage gradient having a high frequency component in said direction of elongation for neturalizing effects of said stray capacitance, the damping resistor comprises a length of resistance wire wound in a plurality of turns around said body, said length providing substantially the entire resistance of said damping resistor and being arranged so as to surround at least a portion of said arrangement adjacent said point, said length of wire being said solid element, and said part of the measuring resistor arrangement is a structure elongated in said direction of elongation and having two structure ends, and comprises a plurality of resistance elements connected electrically in series from a series terminal end to a measuring end which is at least near ground potential, arranged sequentially in said direction of elongation, said plurality of elements providing substantially all the resistance of said measuring resistor, said terminal end of the electrically-connected series of elements and one end of the resistance wire being interconnected at one end of said structure and connected to said terminal, such that turns of the resistance wire adjacent said terminal are adjacent resistance elements at the terminal end of the series; and the damping resistor extends from said terminal, to a point of connection to the smoothed output voltage, in the same direction of elongation as the measuring resistor elements extend from the terminal to the measuring end, whereby attenuation of the high-frequency response of the measuring resistor arrangement is reduced by neutralization of stray capacitance from said resistance elements to ground.

6. An apparatus as claimed in claim 5, characterized in that said structure is mounted to the apparatus such that the direction of elongation extends away from a mounting location to said one end of the structure, whereby said one end is spaced from said mounting location.

7. An apparatus as claimed in claim 6, characterized by comprising means for transferring heat developed in the damping resistor to an insulating medium.

8. An apparatus as claimed in claim 5, characterized in that said plurality of resistance elements comprises a plurality of identical resistors, and said structure includes an elongated board, on which said identical resistors are mounted.

9. An apparatus as claimed in claim 8, characterized by comprising a corresponding plurality of capacitors, each capacitor being connected in parallel with a respective identical resistor.

10. An apparatus as claimed in claim 9, characterized in that said insulating body comprises a hollow member having internal mounting portions, said board being supported by said mounting portions.

11. An apparatus as claimed in claim 9, characterized in that said resistance elements each have a resistance of at least 10 Mohms, and said arrangement is neutralized to extend the 3 db limit frequency to approximately 200 kHz.

12. An arrangement as claimed in claim 9, characterized in that said member is cylindrical with an oval cross-section, and said internal mounting portions comprise connecting portions extending parallel to said axis, and guides for holding said board.

13. An apparatus as claimed in claim 12, characterized in that said measuring resistor arrangement comprises means for making electrical connection between said measuring end and a terminating resistance member, said voltage source, damping resistor and measuring resistor arrangement being part of a high-voltage generator, and said terminating resistance member being external to said high-voltage generator and having a resistance value much less than said identical resistors, whereby said measuring end of said measuring resistor is substantially at ground potential.

* * * * *